(12) United States Patent
Jin et al.

(10) Patent No.: US 10,153,300 B2
(45) Date of Patent: Dec. 11, 2018

(54) SEMICONDUCTOR DEVICE INCLUDING A HIGH-ELECTRON-MOBILITY TRANSISTOR (HEMT) AND METHOD FOR MANUFACTURING THE SAME

(71) Applicant: Taiwan Semiconductor Manufacturing Company Limited, Hsinchu (TW)

(72) Inventors: Jun-De Jin, Hsinchu (TW); Kuan-Chi Tsai, Kaohsiung (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/016,475

(22) Filed: Feb. 5, 2016

(65) Prior Publication Data

US 2017/0229480 A1    Aug. 10, 2017

(51) Int. Cl.
| | |
|---|---|
| *H01L 27/12* | (2006.01) |
| *H01L 21/762* | (2006.01) |
| *H01L 21/84* | (2006.01) |
| *H01L 29/06* | (2006.01) |
| *H01L 29/66* | (2006.01) |
| *H01L 29/778* | (2006.01) |
| *H01L 29/78* | (2006.01) |
| *H03F 3/193* | (2006.01) |
| *H03F 3/195* | (2006.01) |
| *H03F 1/02* | (2006.01) |

(52) U.S. Cl.
CPC .... *H01L 27/1203* (2013.01); *H01L 21/76283* (2013.01); *H01L 21/84* (2013.01); *H01L 29/0649* (2013.01); *H01L 29/66431* (2013.01); *H01L 29/66477* (2013.01); *H01L 29/778* (2013.01); *H01L 29/78* (2013.01); *H03F 1/0205* (2013.01); *H03F 3/195* (2013.01); *H03F 3/1935* (2013.01); *H03F 2200/451* (2013.01)

(58) Field of Classification Search
CPC .............. H01L 21/76283; H01L 21/84; H01L 29/0649; H01L 29/66431; H01L 29/66477; H01L 29/778; H01L 29/78; H01L 27/1203; H03F 3/1935; H03F 1/0205; H03F 3/195; H03F 2200/451
See application file for complete search history.

(56) References Cited

U.S. PATENT DOCUMENTS

| | | | | |
|---|---|---|---|---|
| 4,948,748 | A | * | 8/1990 | Kitahara ............. H01L 21/0262 148/DIG. 12 |
| 5,097,314 | A | * | 3/1992 | Nakagawa ............ H01L 21/761 257/500 |
| 5,476,809 | A | * | 12/1995 | Kobayashi ........ H01L 21/76264 148/DIG. 12 |
| 9,570,359 | B2 | * | 2/2017 | Yang ................. H01L 21/02381 |
| 2006/0205127 | A1 | * | 9/2006 | Kwon ................ G02B 6/12004 438/172 |

(Continued)

*Primary Examiner* — Bitew A Dinke
(74) *Attorney, Agent, or Firm* — Jones Day

(57) ABSTRACT

A semiconductor device comprises a substrate and a high-electron-mobility transistor (HEMT). The substrate is formed with a recess. At least a portion of the HEMT is disposed in the recess. A method for manufacturing the semiconductor device is also disclosed. A radio frequency (RF) front-end module that employs the semiconductor device is also disclosed.

19 Claims, 9 Drawing Sheets

(56) References Cited

U.S. PATENT DOCUMENTS

| | | | |
|---|---|---|---|
| 2007/0072380 A1* | 3/2007 | Wirbeleit | H01L 21/823807 438/303 |
| 2008/0070355 A1* | 3/2008 | Lochtefeld | H01L 21/82341 438/172 |
| 2008/0274595 A1* | 11/2008 | Spencer | H01L 21/76283 438/154 |
| 2010/0181601 A1* | 7/2010 | Tabatabaie | H01L 27/0617 257/213 |
| 2010/0181674 A1* | 7/2010 | Tabatabaie | H01L 21/8258 257/761 |
| 2010/0295104 A1* | 11/2010 | Kaper | H01L 21/8258 257/288 |
| 2011/0108850 A1* | 5/2011 | Cheng | H01L 21/8252 257/76 |
| 2011/0180806 A1* | 7/2011 | Hebert | H01L 29/7787 257/76 |
| 2011/0180857 A1* | 7/2011 | Hoke | H01L 21/76251 257/255 |
| 2011/0227199 A1* | 9/2011 | Hata | H01L 21/02381 257/616 |
| 2011/0241170 A1* | 10/2011 | Haeberlen | H01L 21/82347 257/532 |
| 2011/0316051 A1* | 12/2011 | Takada | H01L 21/0237 257/200 |
| 2012/0270378 A1* | 10/2012 | Kittler | H01L 21/02381 438/400 |
| 2012/0305987 A1* | 12/2012 | Hirler | H01L 29/8128 257/192 |
| 2012/0305992 A1* | 12/2012 | Marino | H01L 21/02381 257/200 |
| 2013/0062696 A1* | 3/2013 | Di | H01L 21/84 257/351 |
| 2014/0131771 A1* | 5/2014 | Flachowsky | H01L 29/66181 257/194 |
| 2014/0191252 A1* | 7/2014 | Lee | H01L 27/092 257/79 |
| 2014/0361371 A1* | 12/2014 | Comeau | H01L 27/1203 257/351 |
| 2015/0014786 A1* | 1/2015 | Jin | H01L 21/8238 257/392 |
| 2015/0015336 A1* | 1/2015 | Yeh | H03F 3/213 330/277 |
| 2015/0059640 A1* | 3/2015 | LaRoche | H01L 21/0237 117/8 |
| 2015/0069517 A1* | 3/2015 | Yang | H01L 21/8252 257/369 |
| 2015/0137139 A1* | 5/2015 | Hirler | H01L 21/8258 257/76 |
| 2015/0318276 A1* | 11/2015 | Bayram | H01L 21/8258 257/195 |
| 2016/0020283 A1* | 1/2016 | Bayram | H01L 21/02381 257/76 |
| 2016/0035899 A1* | 2/2016 | Stulemeijer | H01L 29/78606 327/534 |
| 2017/0005111 A1* | 1/2017 | Verma | H01L 27/1207 |

* cited by examiner

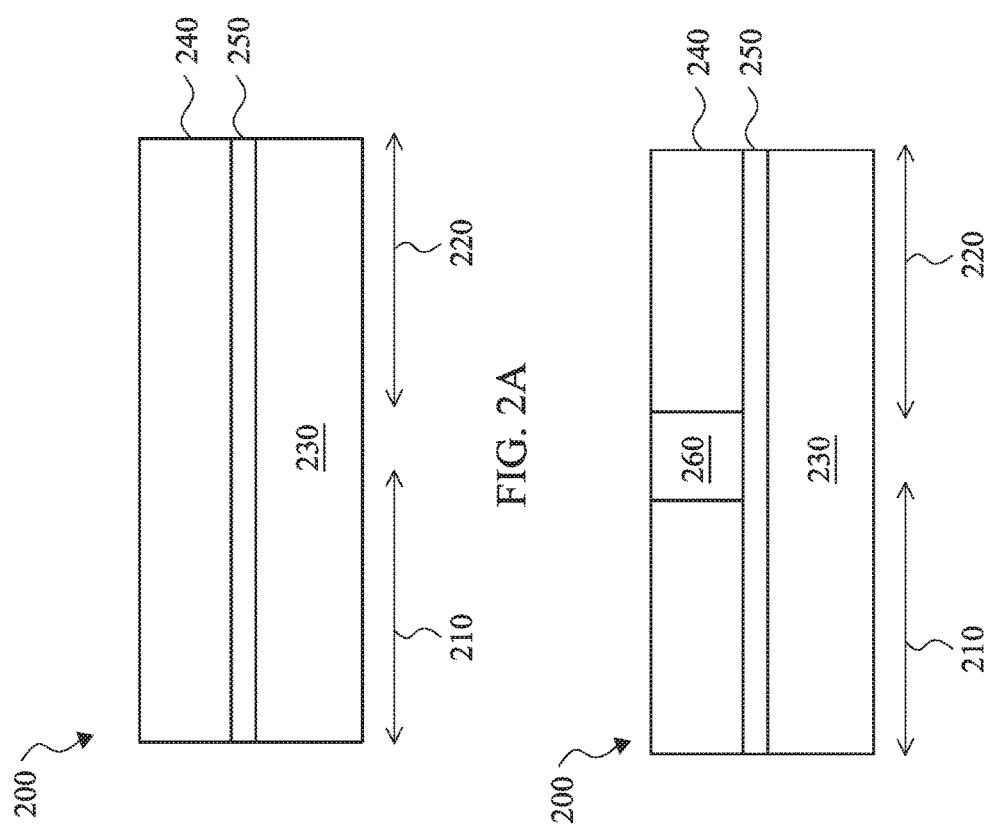

SEMICONDUCTOR DEVICE INCLUDING A HIGH-ELECTRON-MOBILITY TRANSISTOR (HEMT) AND METHOD FOR MANUFACTURING THE SAME

BACKGROUND

Metal-oxide-semiconductor field-effect transistors (MOSFETs) and high-electron-mobility transistors (HEMTs) are used in the art and each have their own merits and uses. Designers have sought a circuit that takes advantage of what these technologies can offer, but have not yet designed a semiconductor device that includes both MOSFETs and HEMTs fabricated using the same substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2E are cross-sectional views of an exemplary semiconductor device at various stages of manufacturing according to some embodiments.

DETAILED DESCRIPTION

Figure 1:
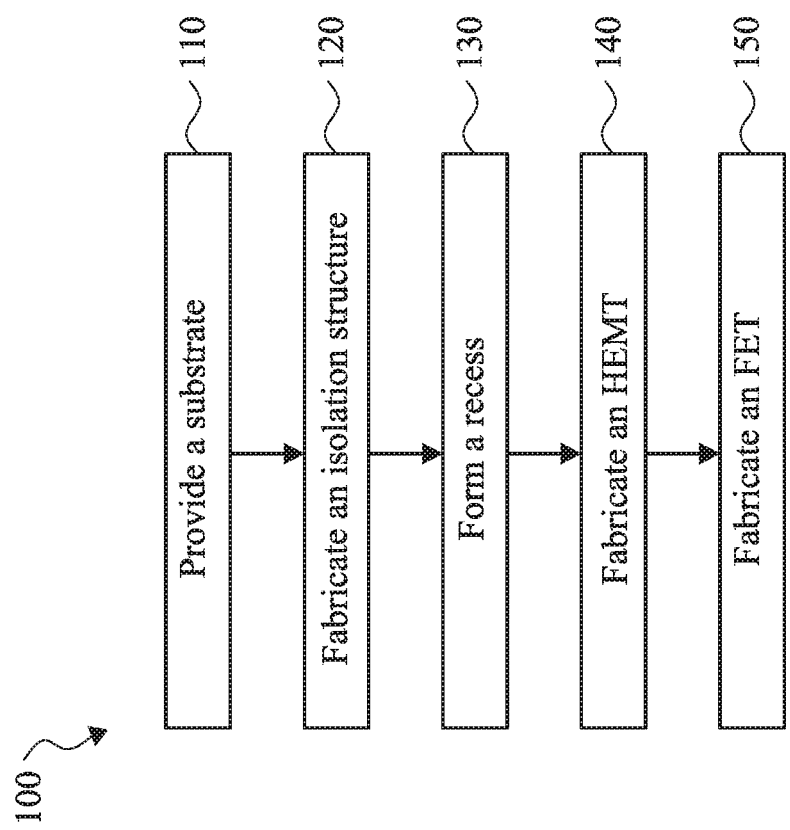
FIG. 1 is a flowchart of an exemplary method for manufacturing a semiconductor device according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underneath," "below," "lower," "above," "on," "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The instant disclosure describes an exemplary semiconductor device that includes a substrate, such as a semiconductor-on-insulator (SOI) substrate. The substrate has a metal-oxide-semiconductor field-effect transistor (MOSFET) region in which a MOSFET, such as a complementary MOSFET (CMOS), is fabricated, and a high-electron-mobility transistor (HEMT) region in which an HEMT, such as a GaN-based HEMT, is fabricated. The instant disclosure further describes an exemplary method for manufacturing the semiconductor device in such a manner that there is minimal degradation of performance in the MOSFET and the HEMT.

With reference to FIGS. 1 and 2A-2E, a method 100 and a semiconductor device 200 are collectively described below. FIG. 1 illustrates a flowchart of an exemplary method 100 for manufacturing a semiconductor device, e.g., the semiconductor device 200 illustrated in FIGS. 2A-2E, according to some embodiments. In this embodiment, the method 100 is for manufacturing a semiconductor device that includes an HEMT and a MOSFET.

Figure 2C:
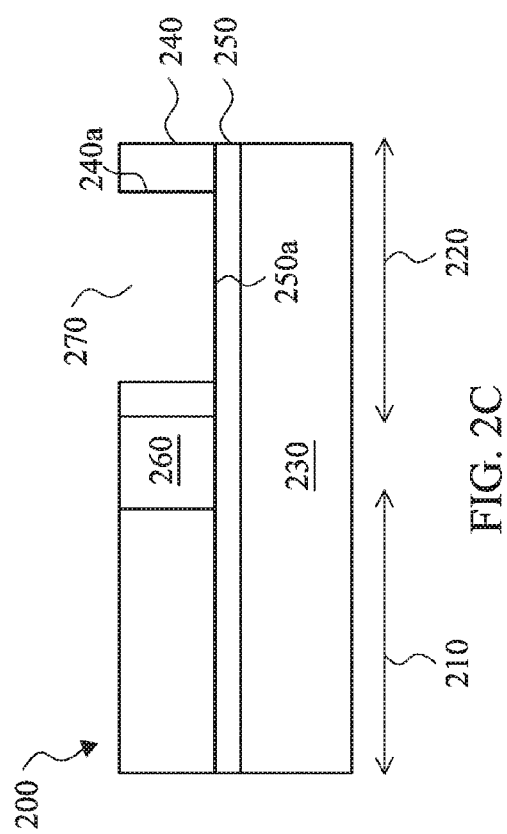

The method 100 begins with the provision of a substrate (block 110), e.g., the substrate in FIG. 2A, that has opposite MOSFET and HEMT regions, e.g., the MOSFET and HEMT regions 210, 220 in FIG. 2A. The method continues with the fabrication of an isolation structure (block 120), e.g., the isolation structure 260 in FIG. 2B, between the MOSFET and HEMT regions of the substrate, such as by forming a trench in the substrate and by filling the trench with an isolation material that is capable of electrically isolating an HEMT, e.g., the HEMT 280 in FIG. 2D, and a MOSFET, e.g., the MOSFET 290 in FIG. 2E. The method continues with the formation of a recess (block 130), e.g., the recess 270 in FIG. 2C, that is disposed in the HEMT region of the substrate, that in an exemplary embodiment extends from a top surface to a bottom surface of a semiconductor substrate layer, e.g., the semiconductor substrate layer 240 in FIG. 2C, of the substrate, and that is defined by a surrounding wall, e.g., the surrounding wall 240a in FIG. 2C, of the substrate. The method continues with the fabrication of the HEMT (block 140), e.g., a GaN-based HEMT, a portion of which is disposed in the recess. In some embodiments, the HEMT has substantially the same height as the surrounding wall of the substrate. In other embodiments, the height of the HEMT is less or greater than the height of the surrounding wall of the substrate. The method continues with the fabrication of the MOSFET (block 150) in the MOSFET region of the substrate.

It is understood that additional processes may be performed before, during, and after the method 100. For example, the method 100 further includes a process in which a top surface of a gate stack of the HEMT is substantially leveled with a top surface of the substrate, a top surface of a source/drain region of the MOSFET, or a top surface of the gate stack of the MOSFET.

FIGS. 2A to 2E illustrate cross-sectional views of the exemplary semiconductor device 200 at various stages of manufacturing according to the method 100 of FIG. 1. First, a substrate is provided. In this embodiment, the substrate is an SOI substrate, but those skilled in the art after reading this disclosure would appreciate that other substrates could be used.

As illustrated in FIG. 2A, the substrate has opposite MOSFET and HEMT regions 210, 220, and includes a first semiconductor substrate layer 230, a second semiconductor substrate layer 240 above the first semiconductor substrate layer 230, and an insulator layer 250 between the first and second semiconductor substrate layers 230, 240. In some embodiments, the first and second semiconductor substrate layers 230, 240 are made of the same material. Examples of materials for the first and second semiconductor substrate layers 230, 240 include, but are not limited to, Si, Ge, SiC, SiGeC and the like. In other embodiments, the first and second semiconductor substrate layers 230, 240 are made of different materials.

In some embodiments, the substrate is manufactured using separation by implantation of oxygen (SIMOX) in which the insulator layer 250, is formed by implanting ions in an implant region of a bulk wafer. The distance of the implant region, i.e., the insulator layer 250, from a surface of the bulk wafer, i.e., the thickness of the second semiconductor substrate layer 240, is controlled by an implant energy at which the SIMOX is performed on the bulk wafer.

In other embodiments, the substrate is manufactured by thermal oxidizing either or both surfaces of the first and second semiconductor substrate layers 230, 240 to produce a thin layer of oxide, i.e., the insulator layer 250. Thereafter, the first and second semiconductor substrate layers 230, 240 are bonded to each other via the insulator layer 250.

It is understood that the insulator layer 250 is referred to in the art of substrate as a buried oxide (BOX). In some embodiments, the substrate is a semiconductor-on-sapphire (SOS) substrate, a semiconductor-on-quartz (SOQ) substrate, or a semiconductor-on-glass (SOG) substrate. In other embodiments, the substrate is a bulk substrate. The bulk substrate is, for example, a bulk Si substrate, a bulk Ge substrate, a bulk SiGe, a bulk SiC substrate, a SiGeC substrate, or other compound semiconductor bulk substrate.

Next, an isolation structure, such as a shallow trench isolation (STI) structure, is fabricated in the second semiconductor substrate layer 240. As illustrated in the FIG. 2B, the isolation structure 260 is between the MOSFET and HEMT regions 210, 220 of the substrate. In certain embodiments, the isolation structure 260 is fabricated, e.g., by first forming a trench in the second semiconductor substrate layer 240 and then by filling the trench with an isolation material, e.g., a dielectric material such as $SiO_2$, or any other isolation material for electrically isolating transistors from each other. Thereafter, excess isolation material is removed by, e.g., chemical-mechanical planarization (CMP).

In various embodiments, prior to the fabrication of the isolation structure 260, initial CMOS process flows may be performed on the substrate. For example, the substrate may be cleaned so that a smooth surface is obtained for the second semiconductor substrate layer 240.

After the formation of the isolation structure 260, a recess is formed in the second semiconductor substrate layer 240. In this embodiment, as illustrated in FIG. 2C, the recess 270 is disposed in the HEMT region 220 of the substrate and extends from a top surface to a bottom surface of the second semiconductor substrate layer 240. In particular, the recess 270 is defined by a base wall 250a of the insulator layer 250 and a surrounding wall 240a of the second semiconductor substrate layer 240 that extends from a periphery of the base wall 250a of the insulator layer 250. In certain embodiments, the formation of the recess 270 includes patterning the second semiconductor substrate layer 240, such as with photolithography, followed by etching, wet or dry. In an alternative embodiment, the recess 270 extends further into the insulator layer 250.

In various embodiments, the surrounding wall 240a of the second semiconductor substrate layer 240 has a height of from about 3.5 um to about 6.5 um. In such various embodiments, the base wall 250a of the insulator layer 250 has a width of from about 50 nm to about 1 um.

Figure 2D:
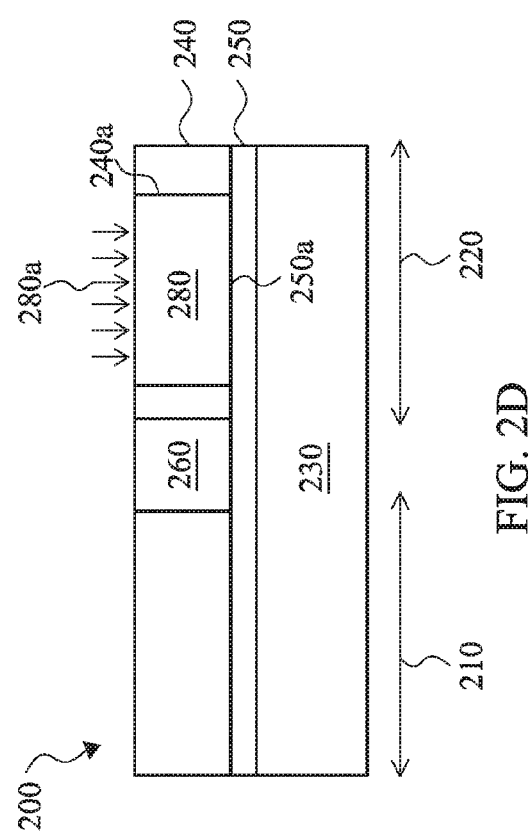

Subsequent to the formation of the recess 270, an HEMT is fabricated in the HEMT region 220 of the substrate. In this embodiment, as illustrated in FIG. 2D, the HEMT 280 is disposed in the recess 270 and has substantially the same height as the surrounding wall 240a of the second semiconductor substrate layer 240.

Figure 3:
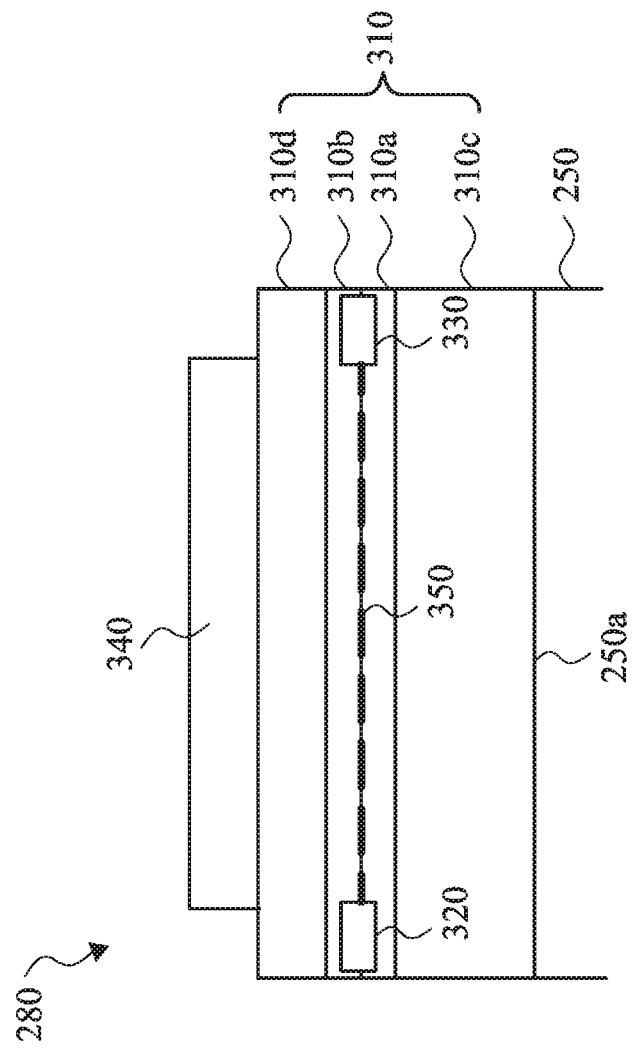
FIG. 3 is a cross-sectional view of an exemplary HEMT of a semiconductor device according to some embodiments.

FIG. 3 illustrates a cross-sectional view of the HEMT 280 according to some embodiments. As illustrated in FIG. 3, the HEMT 280 includes an epitaxial structure 310, a source region 320, a drain region 330, and a gate stack 340. The epitaxial structure 310 includes wide-bandgap layers, i.e., layers that include materials having a bandgap voltage of greater than about 3 eV, namely, a GaN layer 310a and an AlGaN layer 310b. It is understood that the bandgap voltage of a silicon is about 1.0 eV. As such, the HEMT 280 has a relatively high breakdown voltage.

In this embodiment, the GaN layer 310 is grown to a thickness of about 1 um and the AlGaN layer 310b has a compositional formula of $Al_xGa_{1-x}N$ (where 0<x<1), e.g., $Al_{0.25}Ga_{0.75}N$, and is grown on the GaN layer 310a to a thickness of about 20 nm.

The GaN-based HEMT 280 forms its two dimensional electron gas (2 DEG) channel, as indicated by dash line 350, from a high concentration of carriers, i.e., electrons, that is accumulated in the heterojunction, i.e., the junction between the GaN layer 310a and the AlGaN layer 310b, and that is referred to as a "2 DEG" in the art of HEMT. The mobility of the electrons in the 2 DEG channel 350 of the HEMT 280 is relatively high, i.e., greater than about 2000 $cm^2/(V \cdot s)$. It is understood that the electron mobility of a MOSFET, e.g., a Si-based MOSFET is less than 1400 $cm^2/(V \cdot s)$. For this reason, the HEMT 280 has a relatively low on-resistance, i.e., the resistance of its 2 DEG channel during the on-state thereof. Combined with its high breakdown voltage, the HEMT 280 provides faster switching speed and a capability of handling higher power than a MOSFET.

Referring still to FIG. 3, the epitaxial structure 310 further includes a buffer layer 310c and a cap layer 310d. The buffer layer 310c, on which the GaN layer 310a is grown, is between the insulator layer 250 and the GaN layer 310a and is grown on the base wall 250a of the insulator layer 250 to a thickness sufficient to reduce a lattice mismatch between the insulator layer 250 and the GaN layer 310a. For example, the thickness of the buffer layer 310c is from about 2.5 um to about 5.5 um. The cap layer 310d, e.g., a doped GaN layer, serves to prevent oxidation of the AlGaN layer 310b during fabrication and/or operation of the HEMT 280 and is grown on the AlGaN layer 310b to a thickness sufficient to pass electrons therethrough. For example, the thickness of the cap layer 310d is about 20 nm. In an alternative embodiment, the epitaxial structure 310 of the HEMT 280 dispenses with either or both of the buffer layer 310c and the cap layer 310d.

The epitaxial structure 310 is grown using chemical vapor deposition (CVD). In this embodiment, the epitaxial structure 310 is grown by metal organic CVD (MOCVD). In an alternative embodiment, the epitaxial structure 310 is grown by atmospheric pressure CVD (APCVD), low pressure CVD (LPCVD), or plasma-enhanced CVD (PECVD). In some embodiments, the epitaxial structure 310 is grown using molecular beam epitaxy (MBE). In other embodiments, the epitaxial structure 310 is grown using atomic layer deposition (ALD) or a physical vapor deposition (PVD). The growth of the epitaxial structure 310 is carried out at about 1000° C. or higher, i.e., at about 1500° C.

Referring still to FIG. 3, the source and drain regions 320, 330, between which is the 2 DEG channel 350, are at the junction of the GaN layer 310a and the AlGaN layer 310b. In various embodiments, the gate stack 340 includes a gate electrode above the cap layer 310d and a gate dielectric between the cap layer 310d and the gate electrode thereof. In such various embodiments, the gate dielectric of the gate stack 340 includes, e.g., $SiO_2$. As another example, the gate dielectric of the gate stack 340 includes a high-k material. In some embodiments, the gate electrode of the gate stack 340 is formed by deposition of an intrinsic, i.e., undoped, or lightly-doped polysilicon layer, followed by photolithography and removal, such as by dry/wet etching, of excess polysilicon. In other embodiments, the gate electrode of the gate stack 340 includes metal.

Referring back to FIG. 2D, after the formation of the gate stack 340 of the HEMT 280, a CMP, as indicated by arrows 280a, is performed on the gate stack 340 of the HEMT 280, so as to substantially level a top surface of the gate stack 340 of the HEMT 280 with the top surface of the second semiconductor substrate layer 240.

Figure 2E:
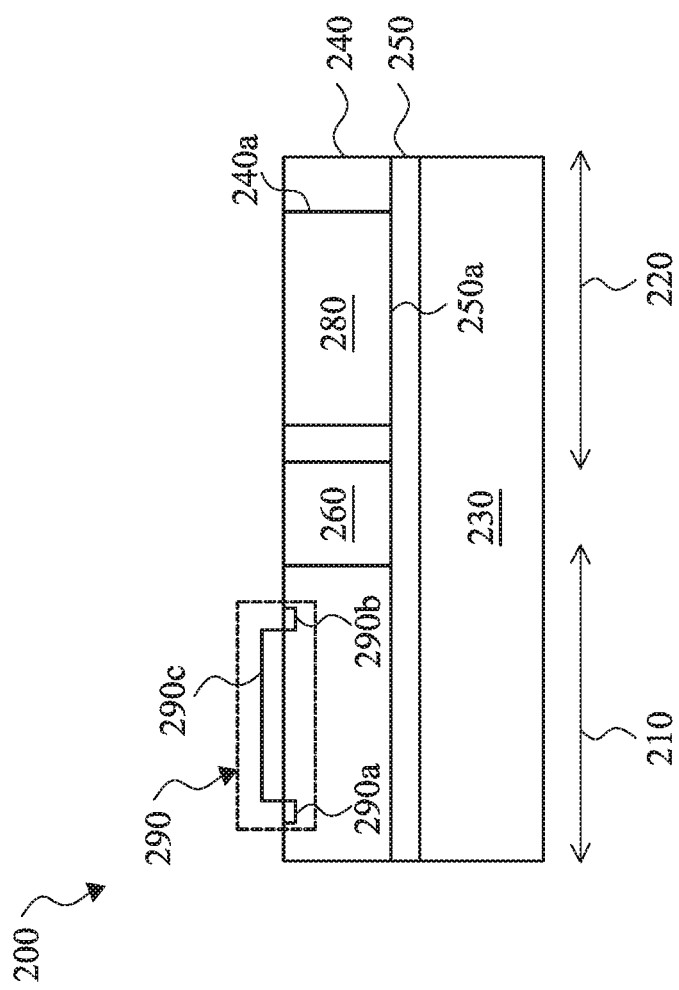

Thereafter, referring to FIG. 2E, a MOSFET 290 is fabricated in the MOSFET region 210 of the substrate. As illustrated in FIG. 2E, the MOSFET 290 includes a source region 290a, a drain region 290b, and a gate stack 290c. The source and drain regions 290a, 290b are disposed in the second semiconductor substrate layer 240 and are doped with an n-type material in some embodiments. In other embodiments, the source and drain regions 290a, 290b are doped with a p-type material.

In various embodiments, the gate stack 290c includes a gate electrode above the second semiconductor substrate layer 240 and a gate dielectric between the second semiconductor substrate layer 240 and the gate electrode thereof. In such various embodiments, the gate dielectric of the gate stack 290c includes, e.g., $SiO_2$. As another example, the gate dielectric of the gate stack 290c includes a high-k material. In some embodiments, the gate electrode of the gate stack 290c is formed by deposition of an intrinsic or lightly-doped polysilicon layer, followed by photolithography and removal, such as by dry/wet etching, of excess polysilicon. In other embodiments, the gate electrode of the gate stack 290c includes metal.

As described above, the fabrication of the MOSFET 290 is performed after the fabrication of the HEMT 280. As such, high processing temperatures, at which the fabrication of the HEMT 280 are carried out, that may cause damage on the MOSFET 290, e.g., unwanted diffusion of doped regions of the MOSFET 290, can be avoided during the fabrication of the MOSFET 290.

In some embodiments, the fabrication of the MOSFET 290 is performed prior to the fabrication of the HEMT 280. In other embodiments, the fabrications of the HEMT 280 and the MOSFET 290 are performed simultaneously. In such other embodiments, the epitaxial structure 310, the source and drain regions 320, 330, and the gate stack 340 of the HEMT 280 and the source and drain regions 290a, 290b, the gate stack 290c of the MOSFET 290 are formed in an alternate manner. For example, the growth of the epitaxial structure 310 of the HEMT 280, the doping of the source and drain regions 290a, 290b of the MOSFET 290, the patterning and etching of the gate electrode of the gate stack 340 of the HEMT 280, and the patterning and etching of the gate electrode of the gate stack 290c of the MOSFET 290 are performed in sequence.

The fabrications of the HEMT 280 and the MOSFET 290 are followed by further CMOS process flows, e.g., back-end-of-line (BEOL), to form various structures, e.g., contacts, vias, and wirings for interconnecting the HEMT 280 and the MOSFET 290.

Referring still to FIG. 2E, the semiconductor device 200 includes a substrate, an isolation structure 260, an HEMT 280, and a MOSFET 290. The substrate defines opposite MOSFET and HEMT regions 210, 220. In this embodiment, the substrate is an SOI substrate and includes a first semiconductor substrate layer 230, a second semiconductor substrate layer 240 above the first semiconductor substrate layer 230, and an insulator layer 250, i.e., a BOX, between the first and second semiconductor substrate layers 230, 240. In an alternative embodiment, the substrate is a bulk substrate.

The isolation structure 260 in this embodiment is a STI structure, and includes an isolation material that fills a trench in the second semiconductor substrate layer 240 and that electrically isolates the HEMT 280 and the MOSFET 290 from each other.

The substrate is formed with a recess, e.g., the recess 270 in FIG. 2C, that is disposed in the HEMT region 220 thereof and that in this embodiment extends from a top surface to a bottom surface of the second semiconductor substrate layer 240, that is to say, the insulator layer 250 includes a base wall 250a, the second semiconductor substrate layer 240 includes a surrounding wall 240a that extends from a periphery of the base wall 250a of the insulator layer 250, and the recess is confined by the base wall 250a of the insulator layer 250 and the surrounding wall 240a of the second semiconductor substrate layer 240. In an alternative embodiment, the recess extends further into the insulator layer 250.

The HEMT 280 is a GaN-based HEMT, is disposed in the recess, and has substantially the same height as the surrounding wall 240a of the second semiconductor substrate layer 240 in this embodiment.

Referring further to FIG. 3, the HEMT 280 includes an epitaxial structure 310, source and drain regions 320, 330, and a gate stack 340. In this embodiment, the epitaxial structure 310 includes a GaN layer 310a, an AlGaN layer 310b, a buffer layer 310c, and a cap layer 310d. The AlGaN layer 310 is grown on the GaN layer 310a. The buffer layer 310c, on which the GaN layer 310a is grown, is between the insulator layer 250 and the GaN layer 310a, is grown on the insulator layer 250, and reduces a lattice mismatch between the insulator layer 250 and the GaN layer 310a. The cap layer 310d, e.g., a doped GaN layer, is grown on the AlGaN layer 310b and serves to prevent oxidation of the AlGaN layer 310b during fabrication and/or operation of the HEMT 280. In an alternative embodiment, the epitaxial structure 310 is dispensed with either or both of the buffer layer 310c and the cap layer 310d.

The source and drain regions 320, 330, between which a 2 DEG channel of the HEMT 280, as indicated by dash line 350, are at a junction of the GaN layer 310a and the AlGan layer 310b. In various embodiments, the gate stack 340 includes a gate electrode above the cap layer 310d and a gate dielectric between the cap layer 310d and the gate electrode thereof. In this embodiment, the gate stack 340 and the second semiconductor substrate layer 240 are substantially flush with each other.

The MOSFET 290 includes source and drain regions 290a, 290b and a gate stack 290c. The source and drain regions 290a, 290b, between which is a MOSFET channel, are disposed in the second semiconductor substrate layer 240. The gate stack 290c includes a gate electrode above the second semiconductor substrate layer 240 and a gate dielectric between the second semiconductor substrate layer 240 and the gate electrode thereof. In this embodiment, the gate stack 340 of the HEMT 280 and the source and drain regions 290a, 290b of the MOSFET 290 are substantially flush with each other.

Figure 4:
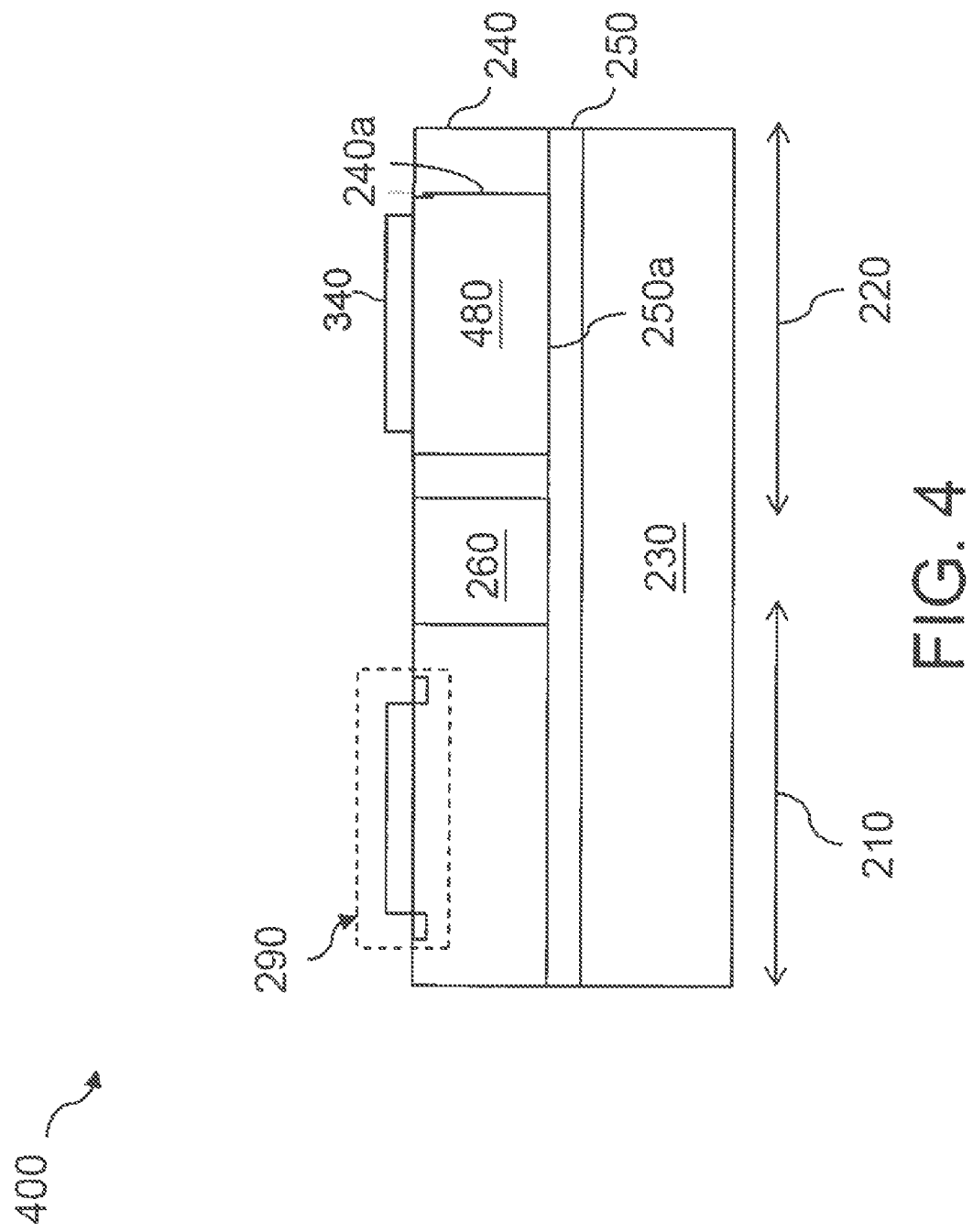
FIG. 4 is a cross-sectional view of another exemplary semiconductor device according to some embodiments.

FIG. 4 illustrates a cross-sectional view of another exemplary semiconductor device 400 according to some invention. The semiconductor device 400 differs from the semiconductor device 200 in that, as illustrated in FIG. 4, the height of an HEMT 480 of the semiconductor device 400 is greater than the height of the surrounding wall 240a of the second semiconductor substrate layer 240. The gate stack 340 of the HEMT 480 is substantially flush with the gate stack of the MOSFET 290.

Further, the method for manufacturing the semiconductor device 400 is similar to the method 100, however, instead of leveling with the top surface of the second semiconductor substrate layer 240, the CMP is performed on the gate stack 340 of the HEMT 480 so as to substantially level the top surface of the gate stack 340 of the HEMT 480 with the top surface of the gate stack of the MOSFET 290.

Figure 5:
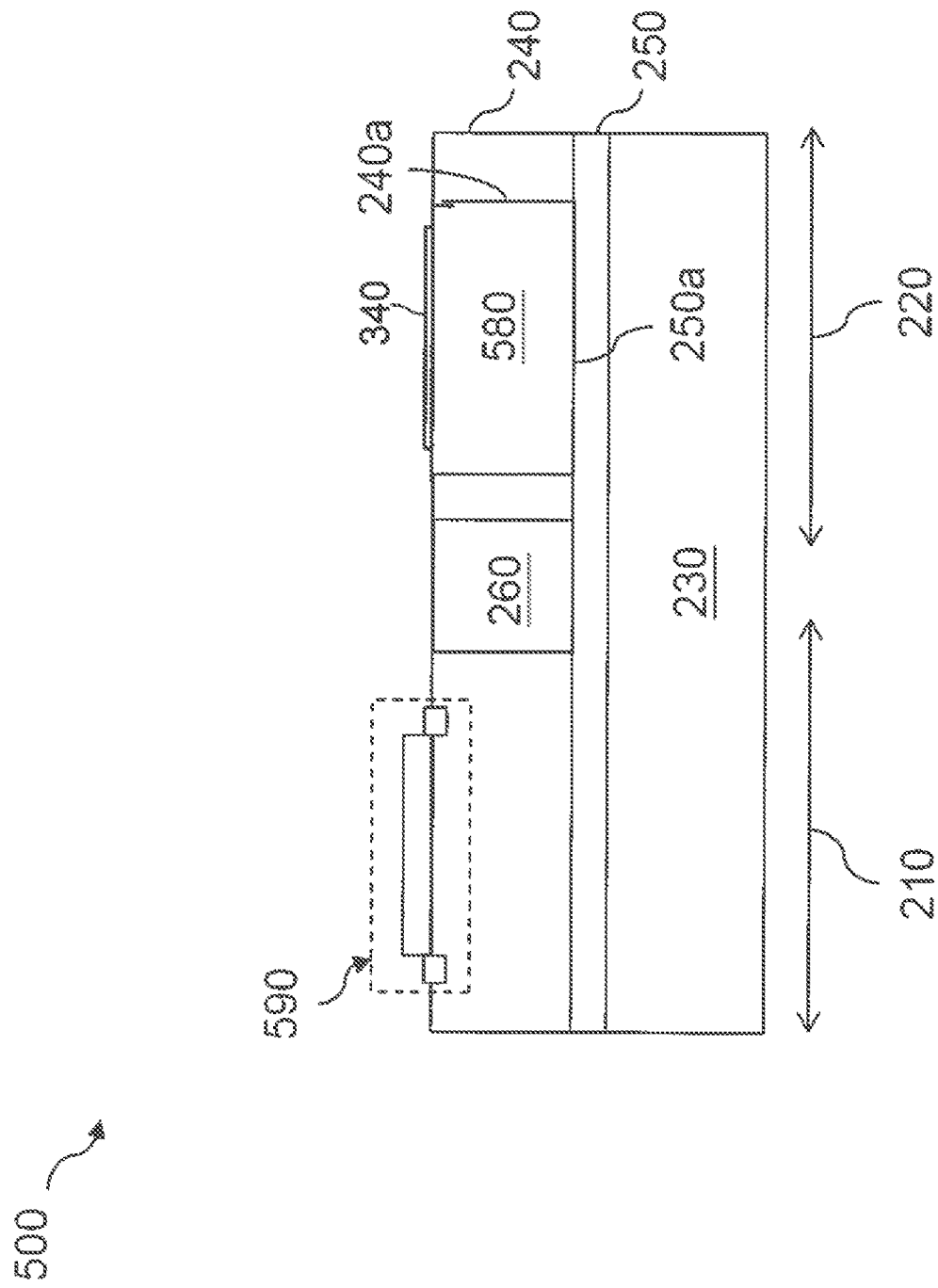
FIG. 5 is a cross-sectional view of another exemplary semiconductor device according to some embodiments.

FIG. 5 illustrates a cross-sectional view of another exemplary semiconductor device 500 according to some invention. The semiconductor device 500 differs from the semiconductor device 200 in that, as illustrated in FIG. 5, the height of an HEMT 580 of the semiconductor device 500 is greater than the height of the surrounding wall 240a of the second semiconductor substrate layer 240. The source and drain regions of a MOSFET 590 are raised source and drain regions and extend from above and into the second semiconductor substrate layer 240. The gate stack 340 of the HEMT 580 is substantially flush with the source and drain regions of the MOSFET 590.

Further, the method for manufacturing the semiconductor device 500 is similar to the method 100, however, instead of leveling with the top surface of the second semiconductor substrate layer 240, the CMP is performed on the gate stack 340 of the HEMT 580 so as to substantially level the top surface of the gate stack 340 of the HEMT 580 with top surfaces of the source and drain regions of the MOSFET 590.

The phrases "substantially level" and "substantially flush" are defined herein to take account of the fact that the top surface of the gate stack of the HEMT may not be perfectly leveled by the CMP with the top surface of the second semiconductor substrate layer of the substrate, the top surface of the gate stack of the MOSFET, or the top surface of the source/drain region of the MOSFET. The phrases "substantially level" and "substantially flush" also reflect that fact that the top surface of the HEMT and the top surface of the second semiconductor substrate layer, the top surface of the gate stack of the MOSFET, or the top surface of the source/drain region of the MOSFET are leveled enough so that physically stable structures may be fabricated thereon. In this embodiment, the top surface of the gate stack of the HEMT and the top surface of the second semiconductor substrate layer of the substrate, the top surface of the gate stack of the MOSFET, or the top surface of the source/drain region of the MOSFET define a vertical distance therebetween of from about 0.1 um to about 1 um, such as from 0.5 um to about 0.3 um.

Figure 6:
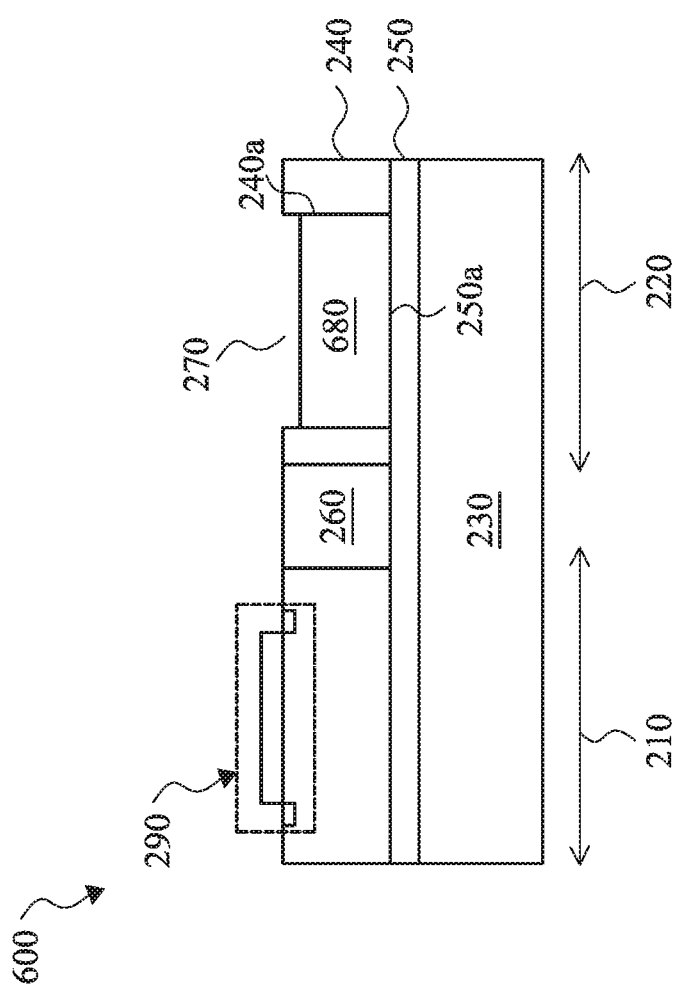
FIG. 6 is a cross-sectional view of another exemplary semiconductor device according to some embodiments.

FIG. 6 illustrates a cross-sectional view of another exemplary semiconductor device 600 according to some invention. The semiconductor device 600 differs from the semiconductor device 200 in that, as illustrated in FIG. 6, the height of an HEMT 680 of the semiconductor device 600 is less than the height of the surrounding wall 240a of the second semiconductor substrate layer 240. Further, the method for manufacturing the semiconductor device 600 is similar to the method 100.

Figure 7:
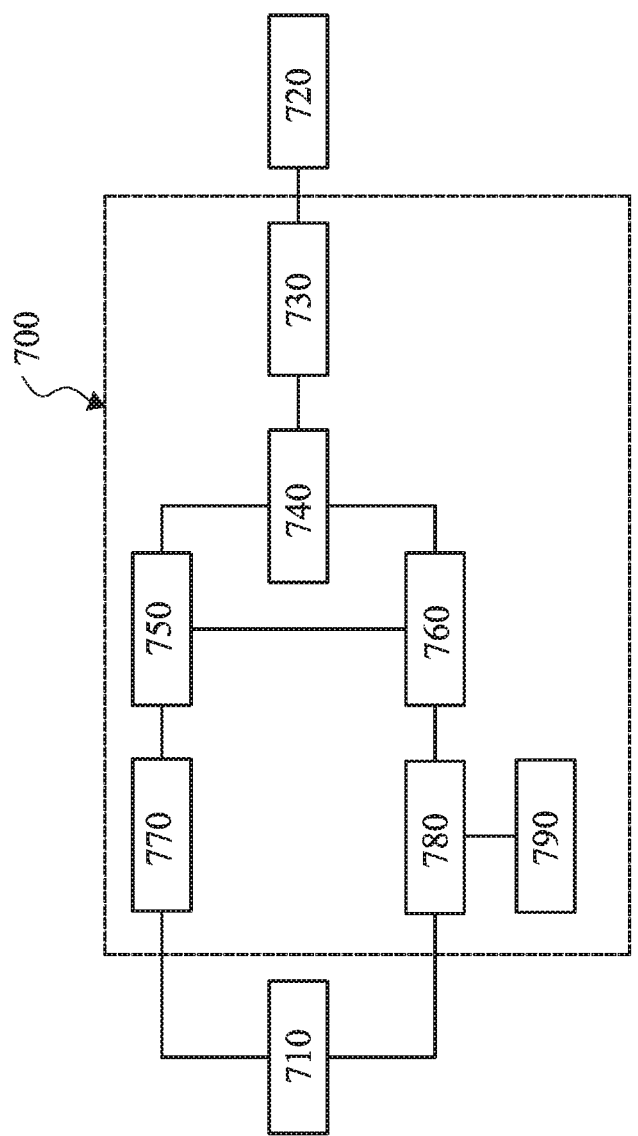
FIG. 7 is a circuit block diagram of an exemplary radio frequency (RF) front-end module according to some embodiments.

FIG. 7 illustrates a circuit block diagram of a radio frequency (RF) front-end module 700 using at least one or a combination of the above-described semiconductor devices 200, 400, 500, 600 according to some embodiments. As illustrated in FIG. 7, the RF front-end module 700 is configured to be coupled between a transceiver 710 and an antenna 720, and includes an antenna tuning unit 730, a Tx/Rx switch 740, a duplexer 750, a band switch 760, a low-noise amplifier (LNA) 770, and a power amplifier (PA) 780.

The antenna tuning unit 730 is configured to be connected to the antenna 720. The Tx/Rx switch 740 is connected between the antenna tuning unit 730 and the duplexer 750 and between the antenna tuning unit 730 and the band switch 760. The duplexer 750 and the band switch 760 are connected to each other. The LNA 770 is connected to the duplexer 750 and is configured to be connected to the transceiver 710. The PA 780 is connected to the band switch 760 and is configured to be connected to the transceiver 710. In this embodiment, at least one of the Tx/Rx switch 740, the band switch 760, the LNA 770, and the PA 780 includes at least one semiconductor device, e.g., the semiconductor device 200, the semiconductor device 400, the semiconductor device 500, the semiconductor device 600, or a combination thereof. As described above, the semiconductor device includes a substrate, an HEMT, and a MOSFET. The substrate has opposite MOSFET and HEMT regions and is formed with a recess disposed in the HEMT region thereof. At least a portion of the HEMT is disposed in the recess. The MOSFET is disposed in the MOSFET region of the substrate.

In an exemplary operation, the antenna tuning unit 730 is tuned to provide an impedance that matches an impedance of the antenna 720. As tuned, the antenna tuning unit 730 receives an inbound RF signal from the antenna 720. The Tx/Rx switch 740 connects the antenna tuning unit 730 to the duplexer 750 that routes the inbound RF signal to the LNA 770. The LNA 770 amplifies the inbound RF signal and provides the amplified inbound RF signal to the transceiver 710 for down-conversion. Concurrently, the PA 780 amplifies an up-converted signal from the transceiver 710 to generate an outbound RF signal that is routed by the band switch 760 to the Tx/Rx switch 740. The Tx/Rx switch 740 connects the band switch 760 to the antenna tuning unit 730 that provides the outbound RF signal to the antenna 720 for transmission.

The RF front-end module 700 further includes a power management unit 790 connected to the PA 780 and is configured to determine power consumption of the PA 780 and to adjust voltages applied to the PA 780 with reference to the power consumption of the PA 780 determined thereby.

It has thus been shown that the semiconductor device of the of the present disclosure includes a substrate that has a MOSFET region in which a MOSFET is fabricated and an HEMT region in which a recess is formed, an HEMT a portion of which is disposed in the recess, and an isolation structure that is fabricated between the MOSFET and HEMT regions and that electrically isolates the MOSFET and the HEMT from each other. The construction as such permits the MOSFET and the HEMT to be combined in a substrate without degradation of performance in the MOSFET and the HEMT.

According to an aspect of the instant disclosure, a semiconductor device is provided. The semiconductor device comprises a substrate formed with a recess, and a high-electron mobility transistor (HEMT), at least a portion of which is disposed in the recess.

According to another aspect of the instant disclosure, a method for manufacturing a semiconductor device is provide. The method comprises providing a substrate, forming a recess in the substrate, and fabricating a high-electron mobility transistor (HEMT), at least a portion of which is disposed in the recess.

According to yet another aspect of the instant disclosure, a radio frequency (RF) front-end module is provided. The FR front-end module comprises an RF switch, an RF amplifier, a duplexer coupled to the RF switch and the RF amplifier, wherein at least one of the RF switch, the RF amplifier, and the duplexer includes a substrate formed with a recess, and a high-electron mobility transistor (HEMT), at least a portion of which is disposed in the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate including an insulator layer and a semiconductor layer disposed on the insulator layer, a recess being formed within the semiconductor layer so as to define a surrounding wall primarily comprising the semiconductor layer, wherein the insulator layer is an oxide of an insulator material;
   an isolation structure formed within the semiconductor layer, extending vertically to contact the insulator layer, and spaced apart from the surrounding wall via the recess and a portion of the semiconductor layer; and
   a high-electron-mobility transistor (HEMT), at least a portion of which is disposed on the insulator layer in the recess and extends vertically above the surrounding wall, wherein the substrate has a HEMT region in which the HEMT is disposed and a metal-oxide-semiconductor field-effect transistor (MOSFET) region opposite to the HEMT region thereof, the insulator layer having a uniform thickness extending continuously in the MOSFET region and the HEMT region,
   wherein the isolation structure is spatially separated from the HEMT region via the portion of the semiconductor layer.

2. The semiconductor device of claim 1, further comprising a MOSFET disposed in the MOSFET region of the substrate.

3. The semiconductor device of claim 2, wherein the MOSFET includes a source/drain region and the HEMT includes a gate stack substantially flush with the source/drain region of the MOSFET.

4. The semiconductor device of claim 2, wherein each of the MOSFET and the HEMT includes a gate stack and the gate stacks are substantially flush with each other.

5. The semiconductor device of claim 2, wherein the isolation structure electrically isolates the HEMT and the MOSFET from one another.

6. The semiconductor device of claim 1, wherein the HEMT has substantially the same height as the surrounding wall of the semiconductor layer.

7. The semiconductor device of claim 1, wherein the HEMT has a height less than a height of the surrounding wall of the semiconductor layer.

8. The semiconductor device of claim 1, wherein the HEMT has a height greater than a height of the surrounding wall of the semiconductor layer.

9. A semiconductor device comprising:
   a substrate including an insulator layer and a semiconductor layer having a first region and a second region, a recess being formed in the first region so as to define a surrounding wall of the first region primarily comprising the semiconductor layer, wherein the insulator layer is an oxide of an insulator material and the insulator layer has a uniform thickness extending continuously in the first region and the second region;
   an isolation structure disposed within the semiconductor layer between the surrounding wall of the first region and the second region, extending vertically to contact the insulator layer, and spaced apart from the surrounding wall via the recess and a portion of the first region; and
   a high-electron-mobility transistor (HEMT) disposed in the first region such that at least a portion of the HEMT is formed in the recess and extends vertically above the surrounding wall, wherein the second region is electrically isolated from the HEMT by the isolation structure,
   wherein the isolation structure is spatially separated from the first region via the portion of the first region.

10. The semiconductor device of claim 9, further comprising: a metal-oxide-semiconductor field-effect-transistor (MOSFET) disposed in the second region.

11. The semiconductor device of claim 10, wherein the MOSFET includes a source/drain region and the HEMT includes a gate stack substantially flush with the source/drain region of the MOSFET.

12. The semiconductor device of claim 10, wherein the MOSFET comprises a source region and a drain region each disposed within the substrate.

13. The semiconductor device of claim 12, wherein each of the MOSFET and the HEMT includes a gate stack and the gate stacks are substantially flush with each other.

14. The semiconductor device of claim 9, wherein the substrate is a semiconductor-on-insulation (SOI) substrate, the semiconductor layer being above the insulator layer and wherein the recess further is defined by a base wall of the insulator layer.

15. The semiconductor device of claim 14, wherein the HEMT has substantially the same dimensions as the recess.

16. The semiconductor device of claim 9, wherein the HEMT has substantially the same height as the surrounding wall of the first region.

17. The semiconductor device of claim 9, wherein the HEMT has a height less than a height of the surrounding wall of the first region.

18. The semiconductor device of claim 9, wherein the HEMT has a height greater than a height of the surrounding wall of the first region.

19. A semiconductor device comprising:
a substrate including an insulator layer, a trench, and a recess, the trench and the recess being different than one another, wherein the insulator layer is an oxide of an insulator material;
isolation material disposed within the trench, extending vertically to contact the insulator layer;
a high-electron-mobility transistor (HEMT) disposed within the recess and extends vertically above a side of the recess;
a metal-oxide-semiconductor field-effect-transistor (MOSFET) disposed either upon or within the substrate such that the HEMT is electrically isolated from the MOSFET by the isolation material within the trench, wherein the insulator layer has a uniform thickness extending continuously beneath the HEMT and the MOSFET,
wherein the trench is spatially separated from the HEMT region via a portion of the substrate.

* * * * *